(12) United States Patent
Cheng et al.

(10) Patent No.: US 7,880,305 B2
(45) Date of Patent: Feb. 1, 2011

(54) TECHNOLOGY FOR FABRICATION OF PACKAGING INTERFACE SUBSTRATE WAFERS WITH FULLY METALLIZED VIAS THROUGH THE SUBSTRATE WAFER

(75) Inventors: Yu-Ting Cheng, Elmsford, NY (US); Sherif A. Goma, Hawthorne, NY (US); John Harold Magerlein, Yorktown Heights, NY (US); Sampath Purushothaman, Yorktown Heights, NY (US); Carlos Juan Sambucetti, Croton on Hudson, NY (US); George Frederick Walker, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/290,049

(22) Filed: Nov. 7, 2002

(65) Prior Publication Data

US 2004/0089948 A1    May 13, 2004

(51) Int. Cl.
*H01L 23/48* (2006.01)
*H01L 23/52* (2006.01)
*H01L 29/40* (2006.01)
(52) U.S. Cl. .............. 257/761; 257/762; 257/E23.145
(58) Field of Classification Search ................ 257/761, 257/762, 769, 698, E23.145
See application file for complete search history.

(56) References Cited

U.S. PATENT DOCUMENTS

| 5,969,422 | A * | 10/1999 | Ting et al. ............. 257/762 |
| 6,181,012 | B1 * | 1/2001 | Edelstein et al. ...... 257/762 |
| 6,187,677 | B1 * | 2/2001 | Ahn ........................ 438/667 |
| 6,281,042 | B1 * | 8/2001 | Ahn et al. ............... 438/108 |
| 6,495,200 | B1 * | 12/2002 | Chan et al. ............. 427/97 |
| 6,525,425 | B1 * | 2/2003 | Woo et al. .............. 257/758 |
| 6,790,775 | B2 * | 9/2004 | Fartash ................... 438/667 |
| 2003/0038344 | A1 * | 2/2003 | Palmer et al. .......... 257/621 |

OTHER PUBLICATIONS

U.S. Appl. No. 09/838725, filed Apr. 1, 2001, Titled, "System on a Package Fabricated on a Semiconductor or Dielectric Wafer," 16 pages +2 sheets Dwgs-Chiu et al.
Baliga, "Packaging Provides Viable Alternatives to SDC"., SI-Jul. 2000 pp. 1-7.
Xinghun Li et al, "High Density Electrical Feedthrough Fabricaten By Deep Reactive Ion Etching of Pyrex Glass"-2001 IEEE pp. 98-101.

* cited by examiner

*Primary Examiner*—Phat X Cao
(74) *Attorney, Agent, or Firm*—Thomas A. Beck; Daniel P. Morris

(57) ABSTRACT

The invention is the technology of providing a packaging intermediate product that can serve as an interface substrate that is to be positioned between different circuitry types where the dimensions are approaching the sub 100 micrometer range. The invention involves a dielectric wafer structure where the first and second area surfaces of the wafer are separated by a distance that is of the order of the electrical via design length, and an array of spaced vias through the wafer arranged with each via filled with metal surrounded by a chemical metal deposition promoting layer with each via terminating flush with a wafer surface. The wafer structure is achieved by forming an array of blind via openings through the first surface of the dielectric wafer to a depth approaching the via design length, lining the walls for adhesion enhancement, filling the blind via openings completely with a chemically deposited metal, removing material at the first wafer surface thereby planarizing the filled vias, and removing material at the second wafer surface thereby exposing the vias at the design length.

2 Claims, 2 Drawing Sheets

TECHNOLOGY FOR FABRICATION OF PACKAGING INTERFACE SUBSTRATE WAFERS WITH FULLY METALLIZED VIAS THROUGH THE SUBSTRATE WAFER

FIELD OF THE INVENTION

The invention relates to the technology involved in the fabrication of insulating wafer structural elements each having an array of sub 100 micrometer size electrical pathways that are to serve as interface substrates between different types of wiring in electronic apparatus.

BACKGROUND AND RELATION TO THE PRIOR ART

The fabrication of insulating wafers that can serve as carriers or substrates for electronic circuitry in which there are to be thousands of vias or through holes of micrometer dimensions that are completely filled with metal and have acceptable electrical impedance and electromigration performance is a subject of considerable importance in the electronic Industry. At the present state of electronic packaging there is generally a lower density of interconnection and wiring in most carriers and substrates than would be available with the integrated semiconductor chip technology. Intense study is taking place on the performance and design advantages of combining different circuitry types and organizations on a dense carrier or substrate with effort being directed to interface problems such as spacing mismatch and the difficulty of bringing signal and power lines in from peripheral supporting members. The technology is at times in the art referred to as System On Package (SOP) technology.

One example of effort in the field, is described in U.S. patent application Ser. No. 09/838,725 Filed Apr. 1, 1901 in which a structure is being contemplated where an interconnecting wafer supports multichip devices attached on one side, while on the opposite side of the wafer connections are made to other modules or boards with a different interconnection technology.

A discussion of the state of studies in the field appears in a 7 page technical article by J. Baliga, titled "Packaging Provides Viable Alternatives to SOC" in the publication "Semiconductor International" in July, 2000.

While much of the reported work is conducted on silicon about which much is known serving as the insulating wafer material, the parameters involved in the invention can readily be extended to other insulating materials; an example being work on the material glass which is reported in the 2001 IEEE Proceedings, pages 98-102 by Li et al titled "High Density Electrical Feedthroughs Fabricated by Deep Reactive Ion Etching of PYREX Glass".

At the present state of the art however, many problems are being encountered as dimensions shrink into the sub 100 micrometer range, such as getting the dimensions of the via openings accurate and uniformly filled with metal yet being sufficiently structurally rigorous that the ability to use the Chemical Mechanical Polishing (CMP) type of processing which involves a combination of abrasion and chemical modifications, is preserved.

SUMMARY OF THE INVENTION

The invention is the technology of providing a packaging intermediate product that serves as an interface substrate that is to be positioned between different circuitry types where the dimensions are approaching the sub 100 micrometer range.

The invention involves a dielectric wafer structure where the first and second area surfaces of the wafer are separated by a distance that is of the order of the electrical via design length, an array of spaced vias through the wafer is arranged with each via filled with metal surrounded by an adhesion layer for promotion of electroless metal deposition on the exposed insulating material in the vias, and with each via terminating flush with an area surface.

The wafer structure is achieved by a technological process in which there is the formation of an array of blind via openings of about 5-50 micrometer in diameter made through the first surface of the dielectric wafer to a depth of about 50-250 micrometers which is approaching the via design length. There is then a conditioning of the walls of the via openings for providing adhesion of a metal delivered through a chemical reaction such as electroless plating. The blind via openings are completely filled with a metal. There is CMP type removal of all material at the first wafer surface, thereby planarizing the filled vias. There is then removal of material at the second wafer surface thereby thinning the wafer until exposing the blind side of the metal filled vias, which are at the design via length.

BRIEF DESCRIPTION OF THE DRAWINGS

FIG. 2, through step illustrations 2A-2G, are cross sectional partial product depictions of the essential features in the fabrication of the structure involved in the invention; wherein:

FIG. 2A illustrates the relative thicknesses in the wafer blank.

FIG. 2B illustrates the masking for the via hole forming operation.

FIG. 2C illustrates the blind via hole after it has been formed.

FIG. 2D illustrates the blind via adhesion enhancement operation.

FIG. 2E illustrates the filling of the blind vias.

FIG. 2F illustrates the mask removal and filled via planarizing operation.

FIG. 2G illustrates the removal operation that exposes the vias.

FIG. 2H illustrates the completed structure of the invention.

DESCRIPTION OF THE INVENTION

In accordance with the invention, a major solution to many of the problems encountered in electronic packaging involving different types of circuitry and technology as packaging interconnect dimensions shrink into the sub 100 micrometer range can be achieved through the construction of an interface substrate for interconnecting the different types of circuitry and technology.

The technology of the invention is illustrated in connection with FIGS. 1 and 2.

Figure 1:
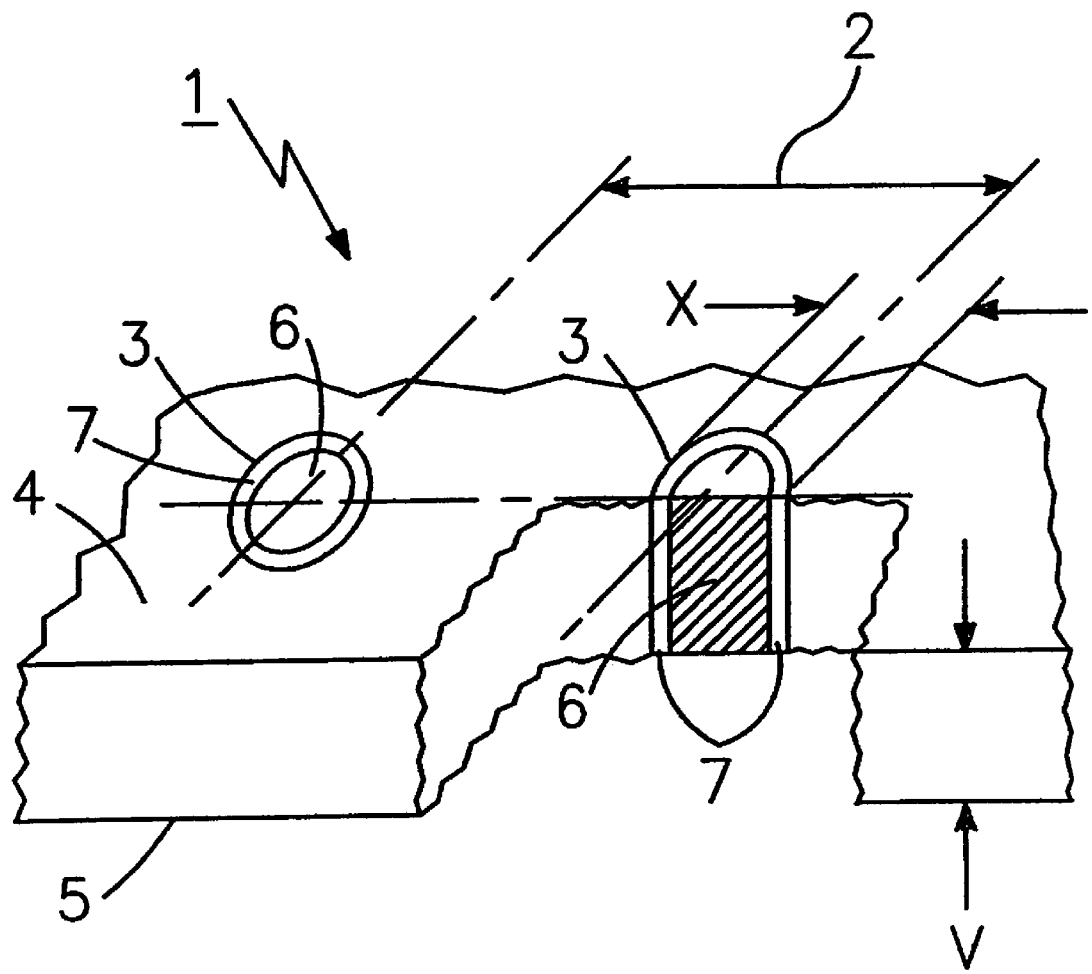
FIG. 1 is a perspective cross sectional depiction of a portion of the intermediate manufacturing product of the invention.
Figure 2:
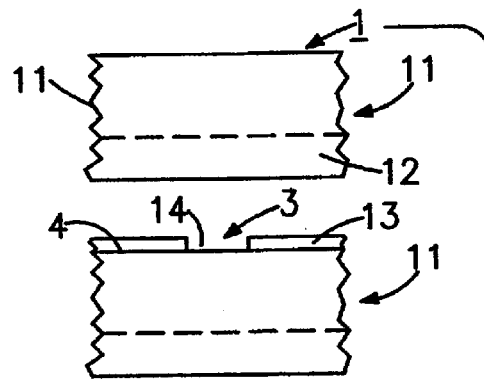
Figure 2:
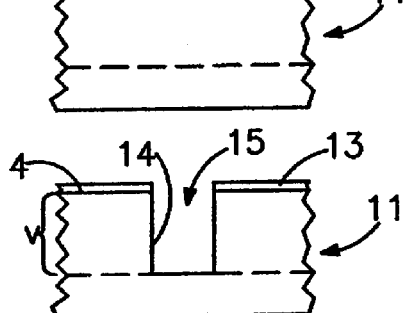
Figure 2:
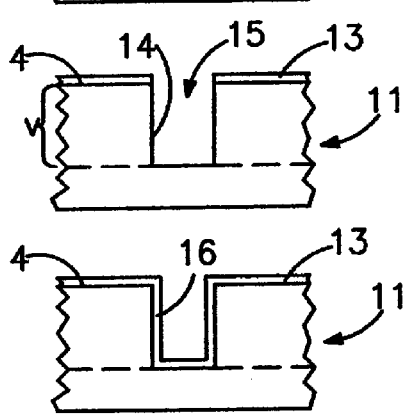
Figure 2:
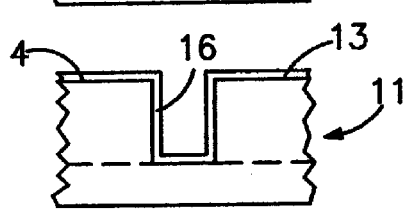
Figure 2:
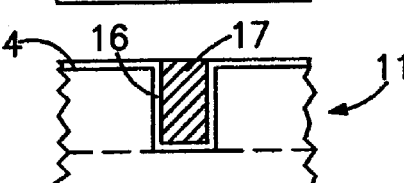
Figure 2:
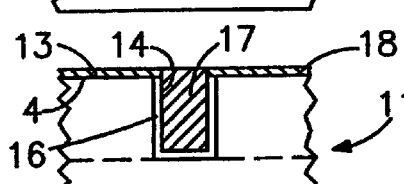
Figure 2:
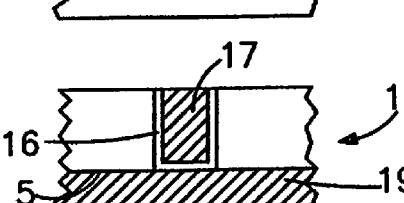
Figure 2:
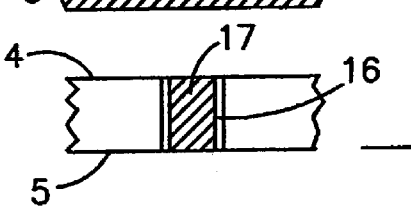

FIG. 1 is a perspective cross sectional depiction of a portion of the structure involved in the invention, and FIG. 2, through step illustrations 2A-2H, illustrates cross sectional partial product depictions of the essential features in the fabrication of the structure.

Referring to FIG. 1 the structure is a wafer 1 of insulating material having an about a 150 micrometer separation array 2, of which a line of two are shown, of electrical pathways or vias 3, that are in the range of about 5 to about 50 micrometers in diameter, and that extend from a first surface 4 to a second surface 5. The surfaces 4 and 5 are such that Chemical Mechanical Processing (CMP) may be employed in planarization without damage to the vias 3 at the surfaces 4 and 5 in the processing. The wafer thickness distance labelled V between the surfaces 4 and 5 is the design length of the electrical pathways or vias 3. The vias 3 are filled with metal 6 that begins and ends flush with the surfaces 4 and 5. In filling the vias, an adhesion member, illustrated as a layer 7, is applied to the exposed insulating material walls of the vias 3. The adhesion member 7, may serve a function as a catalyst in a chemical deposition such as electroless plating. The dimension labelled X is the diameter of the vias 3. The parameter VX is the aspect ratio of the vias 3 which may be in the range of 1:1 to 10:1.

Referring to FIG. 2 together with FIGS. 2A-2H the structure of FIG. 1 can be fabricated with a variety of materials and processes.

In FIG. 2A there is illustrated the features of the wafer 1. The same reference numerals for like items are used where appropriate. The wafer blank is labelled 11 and is of insulating material such as relatively high resistivity silicon semiconductor material. The wafer blank 11 has a total thickness W such that beyond the dotted line defining the to be achieved wafer thickness V the material 12 is available for later removal in thinning to a precise dimension.

In FIG. 2B there is illustrated the masking for an erosion operation in which the array 2 of blind holes that are to become the vias 3 are to be placed in the wafer 11 through surface 4. A masking layer 13 is applied to the surface 4 in a pattern with openings 14 that leaves the surface 4 exposed at each of the openings 14 at the location of each of holes 3. The erosion operation can be achieved through such standard operations as wet etching or reactive ion etching. The masking material 13 is selected to serve as a resist in the erosion process.

In FIG. 2C there is illustrated the result of the erosion operation that produces the blind holes 15 in the insulating blank 11 through the holes 14 in the mask 13. The erosion operation forms the blind hole 15 to a depth that is to define the dimension V.

In FIG. 2D there is illustrated the features of an operation that produces an adhesion member illustrated as a layer 16 on the exposed walls and bottom of the blind holes 15. The adhesion layer 16 may serve as a catalyst in the filling of the blind holes 15 with metal.

In FIG. 2E there is illustrated the filling with a metal 17, such as Ni, by a chemical deposition, such as electroless plating, in the adhesion layer 16 in holes 15. The deposited metal 17 may extend slightly above the surface 4 into the opening 14 in the mask 13. The adhesion layer 16 may be removed by a process such as CMP from surface 4 of the substrate such that the catalyzed deposition of the deposited metal 17 occurs only within the holes. This reduces the amount of extension of metal 17 beyond the surface 4.

In FIG. 2F there is illustrated the features of the mask removal and filled via planarizing operation. The removed portion is the portion 18 shown cross hatched that is made up of the mask material 13 down to the surface 4 including any metal 17 above the surface 4 in the openings 14. The removal is by Chemical Mechanical Processing (CMP) which involves abrasion during the chemical operation resulting in the metal 17 in the via 3 being planarized and flush with the surface 4.

In FIG. 2G there is illustrated the removal operation of the material 12 of the wafer blank 11 shown cross hatched as element 19 that thins the insulating material and exposes the vias 3 thereby positioning the surface 5 at the dimension V with the vias 3 flush at the surface 5.

FIG. 2H illustrates the completed interface substrate structure. The principles of the invention are further illustrated in detail in two examples of the metal 17 filling process as illustrated in FIGS. 2D through 2H.

Example A

Referring to FIG. 2D, the layer 16 is to perform the function of an adhesion layer to assist an electroless plating operation that is to take place as illustrated in FIG. 2E.

The wafer is placed in a sputtering chamber. A layer of 400 Angstrom TaN/400 Angstrom Ta/800 Angstrom Cu is deposited all over the wafer surface 4, the mask 13 and onto the walls and bottom of the blind holes 15. The TaN/Ta is to serve as an adhesion layer 16. It has a special advantage for metallization of the sites inside cavities such as the blind holes 15 a thin layer of Copper (not shown) is deposited to a depth of about 0.6 to 0.8 micro meters followed by a simple mechanical polish or CMP to remove the copper on the surface but leave it in the walls and bottom of the blind holes 15.

The wafer is next immersed in a dilute acid solution to clean any oxides from the thin layer of Cu. Next the wafer is placed in a dilute solution of palladium sulfate, where the reaction of Eq. 1 occurs on the surface and bottom of the blind vias 15.

$$Pd(++)+Cu \ldots Pd(o)+Cu(++). \qquad \text{Eq. 1}$$

As result of this exchange reaction, the surface of the walls and bottom of the blind vias 15 are covered by nanoparticles of a Pd active catalyst illustrated as layer 16 in FIGS. 2D-2H.

Following the catalyst activation, the electroless plating takes place. The wafer is placed in a fast rate electroless Ni plating bath whereby nickel metal is deposited uniformily all along the blind via 15 cavity walls and bottom with good plating uniformity. The plating bath is made up of a Ni salt, a stabilizing or complexing agent, a pH buffer, a reducing agent, and a surfactant. The surfactant insures a low surface tension in the fluid which allows a quick removal of gas bubbles and other reaction products. The resulting plating is uniform without voids.

Example B

Referring again to FIG. 2D the layer 16 is to again perform the function of adhesion facilitation in an electroless plating operation that is to take place as illustrated in FIG. 2E.

The wafer is Silicon and is immersed in a polyfunctional cationic surfactant for about 5 minutes. As the Si and Si/SiO2 surfaces are generally covered with negative Silanol groups (Si—OH(−)), upon immersion in the cationic surfactant, positive charges are created in all the exposed Si surfaces, both on the surface and inside the via walls, by electrostatic attraction. At this point, a multitude of cationic groups (+) are considered to be present on the Si.

The wafer is immersed for about 5-8 minutes in a suspension of a Pd/Sn particulate colloid. The particles of this colloid are charged with a negative charge (−) resulting in a strong attraction and good adhesion strength which makes particles of Pd strongly adhere to all Si surfaces. The Pd colloid may be selectively removed from unwanted areas, by polishing the surface of the wafer, with a mild mechanical polishing of the surfaces leaving the only the Pd catalytic areas on the cavity walls and bottom.

The wafer is then immersed in an electroless plating bath of a lower deposition rate for about 5 minutes to initiate the plating reaction, then followed by immersion in an electroless plating that deposits at a faster rate of about 15 micrometers per hour.

What has been described is the procedural and structural principles of providing a wafer via interface to be positioned between and supporting different circuitry types in electrical apparatus.

What is claimed is:

1. An electrical apparatus consisting of
   first and second different types of circuitry which are interconnected into a functional electrical apparatus unit,
   an interface supporting rigid insulating relatively high resistivity silicon semiconductor wafer element; having first and second essentially parallel planar surfaces and having a thickness V,
   said first type of circuitry being positioned on said first planar surface of said rigid relatively high resistivity silicon semiconductor insulating wafer element
   said second type of circuitry positioned on said second planar surface of said rigid relatively high resistivity silicon semiconductor insulating wafer element,
   said rigid relatively high resistivity silicon semiconductor insulating wafer further having an array of sub 100 micrometer size electrical blind via opening pathways, each said blind via opening pathway having a wall and a bottom, said blind via opening pathway extending from a contact point on said first type of circuitry on said first planar surface of said rigid relatively high resistivity silicon semiconductor insulating wafer element to said bottom of said blind via pathway opening adjacent said second planar surface of said rigid relatively high resistivity silicon semiconductor insulating wafer element, said blind via pathway extending substantially through said rigid relatively high resistivity silicon semiconductor insulating wafer element
   said electrical blind via pathways having a diameter X; and,
   said walls and said bottoms forming said electrical via pathways through said rigid relatively high resistivity silicon semiconductor insulating wafer element being solely filled respectively with an adhesion promoting layer consisting of Cu and TaN/Ta having integrated therein nanoparticles of a Pd active catalyst metal and an electrolessly deposited conducting Ni material situated in contact with said adhesion promoting layer containing said Pd active catalyst metal, each said electrical via pathway terminating at said bottom of said electrical via pathway located adjacent a top of said second planar surface of said rigid relatively high resistivity silicon semiconductor insulating wafer element said electrical via pathway having an aspect ratio V:X in the range of between about 1:1 to 10:1.

2. An electrical apparatus consisting of
   first and second different types of circuitry which are interconnected into a functional electrical apparatus unit,
   an interface supporting rigid insulating relatively high resistivity silicon semiconductor wafer element; having first and second essentially parallel planar surfaces and having a thickness V,
   said first type of circuitry being positioned on said first planar surface of said rigid relatively high resistivity silicon semiconductor insulating wafer element,
   said second type of circuitry positioned on said second planar surface of said rigid relatively high resistivity silicon semiconductor insulating wafer element,
   said rigid relatively high resistivity silicon semiconductor insulating wafer further having an array of sub 100 micrometer size electrical blind via opening pathways, each said blind via opening pathway having a wall and a bottom, said blind via opening pathway extending from a contact point on said first type of circuitry on said first planar surface of said rigid relatively high resistivity silicon semiconductor insulating wafer element to said bottom of said blind via pathway opening adjacent said second planar surface of said rigid relatively high resistivity silicon semiconductor insulating wafer element, said blind via pathway extending substantially through said rigid relatively high resistivity silicon semiconductor insulating wafer element, said electrical blind via pathways having a diameter X; and,
   said walls and said bottoms forming said electrical via pathways through said rigid relatively high resistivity silicon semiconductor insulating wafer element being solely filled respectively with an adhesion promoting layer consisting of Cu and TaN/Ta having integrated therein nanoparticles of a Pd active catalyst metal and an electrolessly deposited conducting material selected from the group consisting of Ni, Co, Cu and Au and combinations thereof situated in contact with said adhesion promoting layer containing said Pd active catalyst metal, each said electrical via pathway terminating at said bottom of said electrical via pathway located adjacent a top of said second planar surface of said rigid relatively high resistivity silicon semiconductor insulating wafer element, said electrical via pathway having an aspect ratio V:X in the range of between about 1:1 to 10:1.

* * * * *